(12) United States Patent
Sato et al.

(10) Patent No.: US 6,930,757 B2
(45) Date of Patent: Aug. 16, 2005

(54) MANAGING METHOD OF EXPOSURE APPARATUS, MANAGING METHOD OF MASK, EXPOSURE METHOD, AND MANUFACTURING METHOD OF SEMICONDUCTOR DEVICE

(75) Inventors: Takashi Sato, Fujisawa (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/636,613

(22) Filed: Aug. 8, 2003

(65) Prior Publication Data

US 2004/0130698 A1 Jul. 8, 2004

(30) Foreign Application Priority Data

Aug. 8, 2002 (JP) .......................................... 2002-231862

(51) Int. Cl.[7] .............................................. G03B 27/42
(52) U.S. Cl. ........................ 355/53; 355/77; 250/492.2; 430/5; 430/30; 430/311
(58) Field of Search ............................. 355/53, 55, 77; 250/492.1, 492.2; 430/5, 30, 311

(56) References Cited

U.S. PATENT DOCUMENTS

| | | | |
|---|---|---|---|
| 5,243,377 A | 9/1993 | Umatate et al. | |
| 6,361,907 B1 * | 3/2002 | Nam et al. | 430/22 |
| 6,444,375 B1 * | 9/2002 | Nam et al. | 430/5 |
| 2003/0037309 A1 * | 2/2003 | Utsunomiya | 716/21 |

FOREIGN PATENT DOCUMENTS

| | | |
|---|---|---|
| JP | 04-063417 | 2/1992 |
| JP | 3104636 | 9/2000 |
| JP | 2001-085317 | 3/2001 |

* cited by examiner

Primary Examiner—D. Rutledge
(74) Attorney, Agent, or Firm—Finnegan, Henderson, Farabow, Garrett & Dunner, L.L.P.

(57) ABSTRACT

There is disclosed a managing method of an exposure apparatus comprising selecting one or more exposure apparatuses out of a plurality of the exposure apparatuses for each a predetermined partial exposure area, whose dimensional differences of each an exposed pattern among the exposure apparatuses are within a predetermined permissible range in each the predetermined partial exposure area in a whole of an exposure area which is the exposed patterns are transferred using the exposure apparatuses, and managing the exposure apparatuses which are selected for each the predetermined partial exposure area, as a group of the exposure apparatuses, by grouping the exposure apparatuses for each the predetermined partial exposure area.

33 Claims, 3 Drawing Sheets

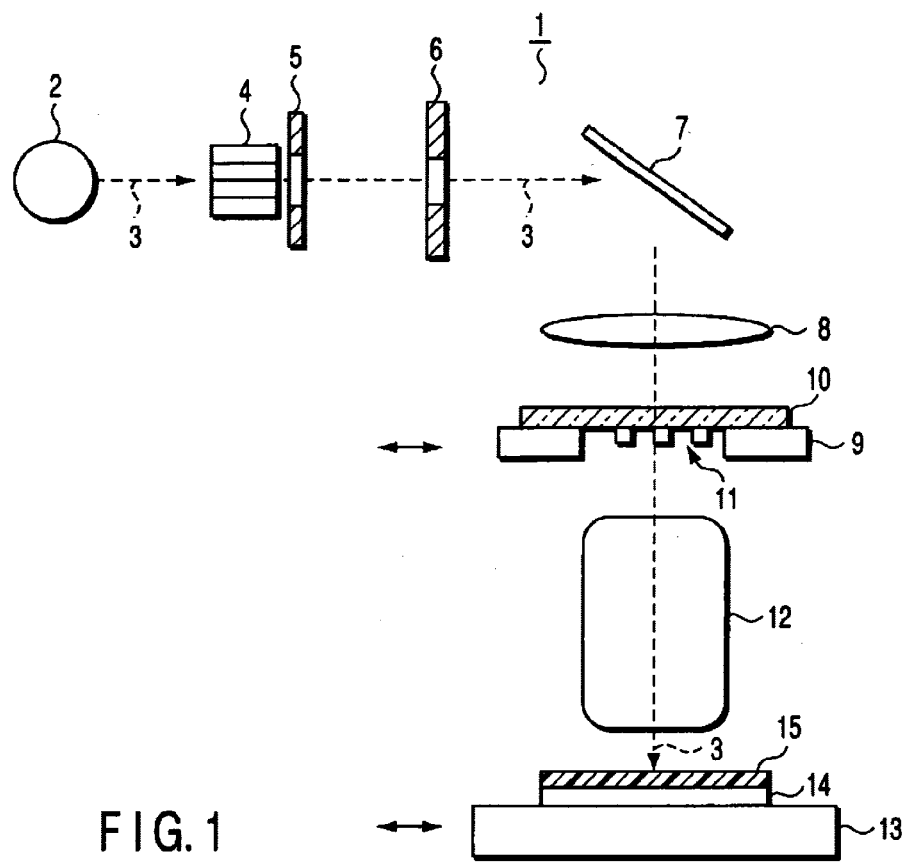
FIG. 1
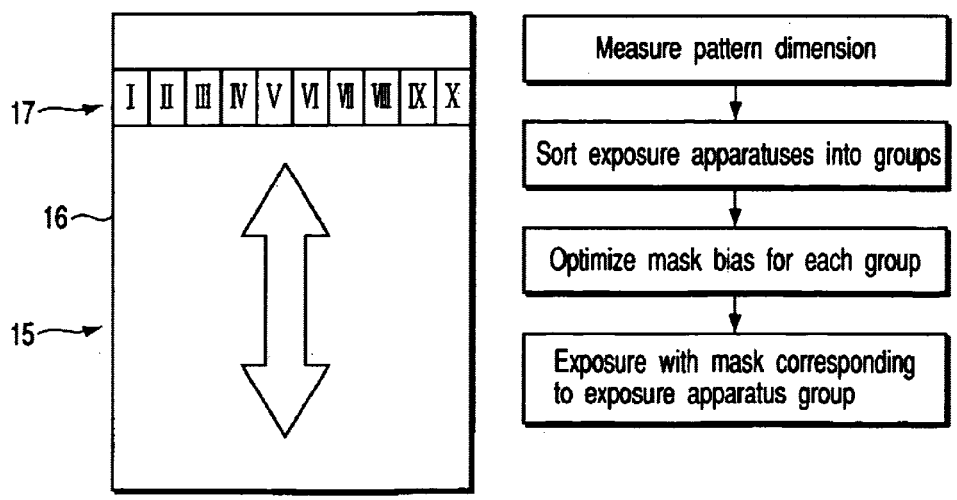
FIG. 2
FIG. 5

MANAGING METHOD OF EXPOSURE APPARATUS, MANAGING METHOD OF MASK, EXPOSURE METHOD, AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2002-231862, filed on Aug. 8, 2002; the entire contents of which are incorporated herein by reference.

BACKGROUND OF THE INVENTION

1. Field of the Invention

The present invention relates to a lithography process in a series of manufacturing processes of a semiconductor device, particularly to a managing method of an exposure apparatus for use in an exposure process of transferring a mask pattern, a managing method of a mask, an exposure method, and a manufacturing method of a semiconductor device.

2. Description of the Related Art

In general, a plurality of the exposure apparatuses is used to carry out an exposure operation in a lithography process. For the exposure apparatus, same exposure characteristics have to be ideally imparted even among a plurality of the exposure apparatuses, but actually a difference is generated among the exposure apparatuses. Therefore, even when the exposure apparatuses having same specifications are used to carry out an exposure operation, a difference is generated in finish of a pattern.

A typical example of the difference of the exposure characteristic is distortion generated while a projection/exposure process is carrying out. When the distortion is generated, a deviation is caused between standard grid coordinates and actual exposure coordinates within an exposure area. An amount of the deviation is generally about 20 to 30 nm, but an amount or a direction of the distortion differs among the individual exposure apparatuses. Therefore, for example, on an occasion of a superposition exposure is performed, even if the amount of a deviation of the superposition exposure can be set to 0 at a center of an exposure area, an error of the superposition exposure is generated in a whole of the exposure area in most cases.

To solve such a problem caused by distortion which occurs in carrying out the exposure operation by using the plurality of exposure apparatuses, for example, the following methods have been tried. First, the amount of distortion of each of the plurality of exposure apparatuses are compared with one another. Next, the exposure apparatuses are grouped so as to comprise a group of one or more exposure apparatuses, whose distortion amount differences are within a predetermined permissible range. Then, in a patterning process, the exposure operation is carried out using the exposure apparatus in the group whose distortion amount satisfies a desired permissible value. Details of a typical example of the exposure method are described in Japanese Patent No. 3104636.

When a plurality of exposure apparatuses are used, the problem concerning the deviation of the superposition exposure by the distortion difference among the respective apparatuses has gradually been improved by enhancement of capabilities of the exposure apparatus and enhancement of a control method. However, in recent years, it has been clear that causes for generation of a dimensional error of a resist pattern among the plurality of exposure apparatuses are not limited to the deviation of the superposition exposure by the distortion differences among the respective apparatuses, and other various causes also exist.

For example, with miniaturization of the resist pattern, there is hardly a difference between a resolution theoretical limit value of an optical system of the exposure apparatus and a dimension value of the actually formed pattern, and a dimensional precision of the pattern has been largely influenced by a small error of the optical system. The precision of the pattern itself required for forming the resist pattern having a micro dimension also needs to be high. Concretely, for example, when the resist pattern having a line width of about 110 to 130 nm is formed, the dimensional precision is necessary to such an extent that the error in the exposure area is about 10 nm or less, but it is very difficult to satisfy this precision. A main cause for this lies in that a manufacturing error is included in the line width of the mask pattern formed in a reticle (mask). However, even when the mask including an ideal mask pattern formed without any error is charged as such into the exposure apparatus to carry out the exposure, it is almost impossible to secure the above-described dimensional precision because of a transfer error of the exposure apparatus itself.

That is, the dimension of the resist pattern fluctuates because the exposure apparatus includes an error from an ideal state. When dimensional error factors such as illuminating $\sigma$, a numerical aperture NA of a lens, illuminance, astigmatism, and spherical aberration change in the exposure area, the dimension of the formed resist pattern also changes. With respect to the dimensional fluctuations of the resist pattern, these dimensional error factors independently exert influences in some cases, and exert interactions and influences in other cases. Moreover, the exposure apparatus of a semiconductor manufacturing apparatus is designed and adjusted beforehand so that the pattern can be transferred up to the resolution limit of the optical system. Therefore, a change amount of each dimensional error factor described above is extremely small. It is therefore very difficult to further reduce the dimensional error factor itself or to constantly hold the dimensional fluctuation of the resist pattern in the surface of a wafer (resist film).

Moreover, when the dimensional error of the resist pattern exceeds the permissible range, it is difficult to form various micro semiconductor elements to be incorporated in a semiconductor device in appropriate states. Additionally, there is possibility that quality or yield of the whole semiconductor device drops.

BRIEF SUMMARY OF THE INVENTION

According to an aspect of the invention, there is provided a managing method of an exposure apparatus, comprising: selecting one or more exposure apparatuses out of a plurality of the exposure apparatuses for each a predetermined partial exposure area, whose dimensional differences of each an exposed pattern among the exposure apparatuses are within a predetermined permissible range in each the predetermined partial exposure area in a whole of an exposure area which is the exposed patterns are transferred using the exposure apparatuses; and managing the exposure apparatuses which are selected for each the predetermined partial exposure area, as a group of the exposure apparatuses, by grouping the exposure apparatuses for each the predetermined partial exposure area.

According to another aspect of the invention, there is provided a managing method of a mask, comprising: selecting one or more masks out of a plurality of masks using together with at least one exposure apparatus for each a predetermined partial exposure area, whose dimensional differences of each an exposed pattern among the masks are within a predetermined permissible range in each the predetermined partial exposure area in a whole of an exposure area which is the exposed patterns are transferred based on each a mask pattern formed in the masks; and managing the masks which are selected for each the predetermined partial exposure area, as a group of the masks, by grouping the masks for each the predetermined partial exposure area.

According to a further aspect of the invention, there is provided an exposure method comprising: selecting and grouping one or more exposure apparatuses out of a plurality of the exposure apparatuses for each a predetermined partial exposure area beforehand with transferring mask patterns formed in a plurality of mask onto a substrate using the exposure apparatuses, whose dimensional differences of each an exposed pattern among the exposure apparatuses, transferred onto the substrate based on each the mask pattern, are within a predetermined permissible range in each the predetermined partial exposure area in a whole of an exposure area which is provided on the substrate and is the exposed patterns are transferred; and transferring the mask patterns onto the substrate for each a predetermined partial exposure area using the one or more exposure apparatuses belonging to each a group of exposure apparatuses corresponding to the predetermined partial exposure areas.

According to yet another aspect of the invention, there is provided a manufacturing method of a semiconductor device, comprising: selecting and grouping one or more exposure apparatuses out of a plurality of the exposure apparatuses for each a predetermined partial exposure area beforehand with transferring mask patterns formed in a plurality of mask onto a substrate using the exposure apparatuses, whose dimensional differences of each an exposed pattern among the exposure apparatuses, transferred onto the substrate based on each the mask pattern, are within a predetermined permissible range in each the predetermined partial exposure area in a whole of an exposure area which is provided on the substrate and is the exposed patterns are transferred; transferring the mask patterns onto the substrate for each a predetermined partial exposure area using the one or more exposure apparatuses belonging to each a group of exposure apparatuses corresponding to the predetermined partial exposure areas; and carrying out an etching process based on each the mask pattern transferred onto the substrate.

BRIEF DESCRIPTION OF THE SEVERAL VIEWS OF THE DRAWING

FIG. 1 is a diagram showing a schematic composition of an exposure apparatus for use in one embodiment;

FIG. 2 is a plan view schematically showing a correlation between an exposure area of a resist film exposed by the exposure apparatus of FIG. 1 and a slit area of a reticle;

FIG. 5 is a flowchart showing a major part of a sequence of an exposure method according to one embodiment.

DETAILED DESCRIPTION OF THE INVENTION

Figure 3:
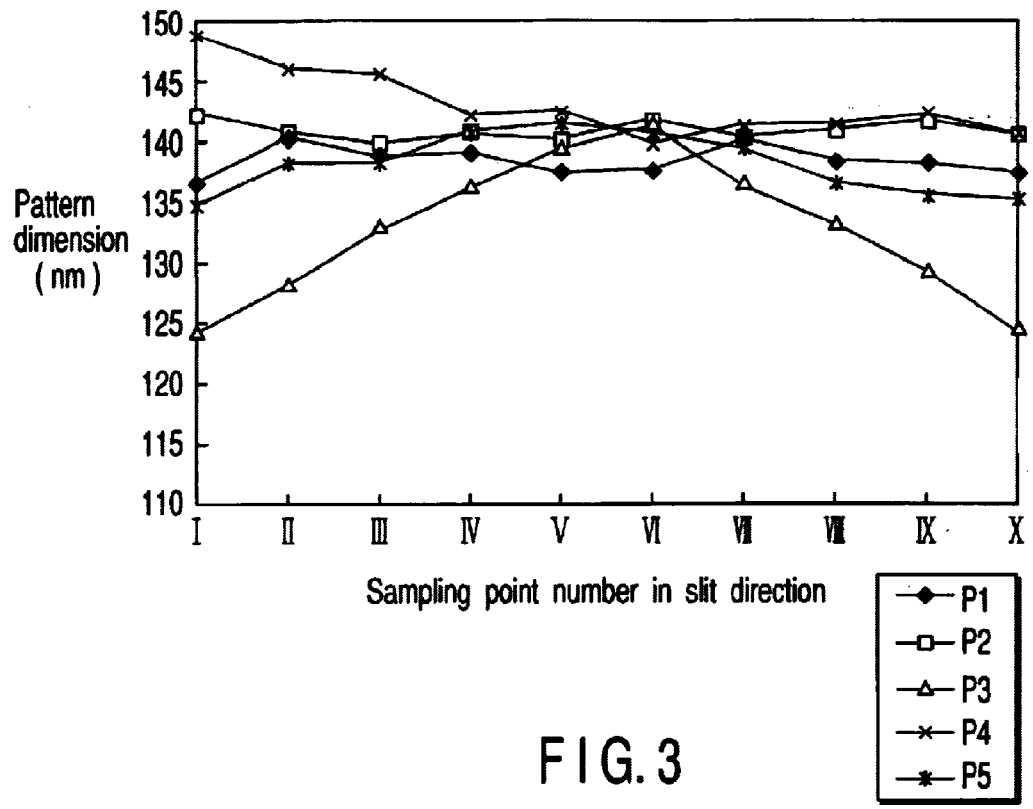
FIG. 3 is a graph showing a dimensional fluctuation of a resist pattern exposed by a plurality of exposure apparatuses in the slit area.

Details of the present invention will be described hereinafter by means of a shown embodiment.

FIG. 1 shows a schematic composition of an exposure apparatus 1 for use in one embodiment of the present invention. In the present embodiment, an ArF excimer laser beam 3 having a wavelength of about 193 nm is used as an exposure light. Therefore, an ArF excimer laser beam generation apparatus 2 is used in an exposure light source. The ArF excimer laser beam 3 is transmitted through a fly eye lens 4 to form a secondary light source. The ArF excimer laser beam 3 transmitted through the fly eye lens 4 is incident upon an illuminating aperture 5 disposed in a secondary light source plane. The illuminating aperture 5 determines an illuminating shape and illuminating coherency a. The ArF excimer laser beam 3 transmitted through the illuminating aperture 5 is incident upon a reticle blind 6. The reticle blind 6 is disposed in a position optically conjugated with a reticle 10 described later to determine an illuminating area of the reticle 10. The ArF excimer laser beam 3 transmitted through the reticle blind 6 is reflected by a reflective mirror 7, and a travel direction of the beam is changed so that the beam is incident upon a condenser lens 8. The condenser lens 8 is adjusted so that illumination of the reticle 10 forms Koehler illumination.

The reticle 10 laid on a reticle stage 9 is irradiated with ArF excimer laser beam 3 incident upon the condenser lens 8 by the condenser lens 8. A mask pattern 11 having a predetermined shape is formed in the reticle 10. This reticle 10 is also referred to as a mask. An area in which the mask pattern 11 of the reticle 10 is formed is irradiated with the ArF excimer laser beam 3 transmitted through the condenser lens 8. The ArF excimer laser beam 3 incident upon a slit area in the area of the reticle 10 in which the mask pattern 11 is formed is transmitted through the area, and is incident upon a projection lens 12. A wafer 14 laid on a wafer stage 13 is irradiated with the ArF excimer laser beam 3 incident upon the projection lens 12 by the projection lens 12. A resist film 15 (photoresist film) is disposed on the surface (upper surface) of the semiconductor substrate (wafer) 14. When the ArF excimer laser beam 3 reaches the resist film 15, the resist film 15 is exposed, and an exposed pattern (not shown) based on the mask pattern 11 is reduced/transferred onto the resist film 15. The resist film 15 onto which the exposed pattern is transferred is developed. Accordingly, a resist pattern (not shown) having the predetermined shape based on the exposed pattern is formed in the resist film 15.

In the present embodiment, a so-called scan type of exposure apparatus 1 is used as the exposure apparatus. Therefore, the reticle stage 9 and wafer stage 13 are scanned so that the reticle 10 and wafer 14 can move in synchronization with each other. This scan operation is carried out during the exposure of the resist film 15.

FIG. 2 schematically shows a relative relationship between an exposure area 16 on the resist film 15 exposed using the exposure apparatus 1 and a slit area 17 of the reticle 10 projected onto the wafer 14. A white arrow in FIG. 2 shows the direction of scan of the slit area 17 by the movement of the reticle stage 9 and wafer stage 13. In the present embodiment, the reticle stage 9 and wafer stage 13 are set to move in mutually opposite directions. By the reticle blind 6, only the slit area 17 is irradiated with the ArF excimer laser beam 3 which is an illuminating light. During the exposure of the resist film 15, the slit area 17 scans entirely over the exposure area 16 along the direction shown by the white arrow in FIG. 2, and the resist pattern is accordingly transferred onto the whole exposure area 16. In the present embodiment, the dimension of the slit area 17 is set to about 5 mm×about 26 mm. The dimension of the exposure area 16 is set to about 33 mm×about 26 mm.

The present inventors carried an exposure experiment when the following conditions in order to check the dimensional fluctuation of the exposed pattern in the slit area 17. The ArF excimer laser beam 3 having a wavelength of about 193 nm is used as an exposure light. The illuminating coherency ($\sigma$) is set to about 0.75, an illuminating shape is set to $\frac{2}{3}$ annular band illumination, and numerical aperture (NA) is set to 0.6. The resist pattern having a dimension of about 0.14 $\mu$m is formed in the resist film 15 on the wafer 14. In this case, for the exposure apparatus 1, five scan type exposure apparatuses P1, P2, P3, P4, and P5 were used to perform the exposure under the same condition described above. FIG. 3 shows measurement results of the dimensions of the respective exposed patterns transferred onto the resist film 15 by the exposure apparatuses P1 to P5. In the present embodiment, it is assumed that a dimensional error of the exposed pattern is checked based on the measured result of the dimension of each resist pattern formed based on the exposed pattern transferred onto the resist film 15 by the exposure operation.

FIG. 3 is a graph showing the dimensional fluctuation of each exposed pattern transferred by five units P1 to P5 of the exposure apparatuses 1 in the slit area 17. This will be described in detail. As shown in FIG. 2, the dimension of each resist pattern was measured in ten sampling points I to X set substantially at equal intervals along a longitudinal direction of the slit area 17 crossing at right angles to the scan direction. The longitudinal direction of the slit area 17 will hereinafter be referred to as a slit direction. As apparent from FIG. 3, even when five exposure apparatuses 1 of the same type are used to carry out the exposure under the same conditions, the dimensional fluctuation of each resist pattern differs with each exposure apparatus 1. It is also seen that tendency of the dimensional fluctuation of each resist pattern differs in the slit direction. It is to be noted that although not shown, any of the units P1 to P5 of the exposure apparatuses 1 indicated substantially the same tendency concerning the dimensional fluctuation in the scan direction of each resist pattern (scattering of the dimension).

This result is considered to be caused by the following reasons. For causes for dimensional fluctuation of the resist pattern in the exposure area 16, optical factors of an illumination or projection optical system in the exposure area 16 are main. Therefore, since the resist pattern is transferred with respect to the scan direction substantially under the same optical conditions, the dimensional fluctuation is small. On the other hand, since the optical conditions differ with places in the slit direction, the dimensional fluctuation is generated in the resist pattern.

It is seen from FIG. 3 that an actual dimensional precision (dimensional fluctuation) of the resist pattern whose target dimension value is set to 140 nm can be within a range of about ±5 nm in the exposure area 16 only in three units P1, P2, and P5 of the exposure apparatuses 1. Here, three units P1, P2, and P5 of exposure apparatuses 1 are grouped in a group A, and the other exposure apparatuses 1 are grouped in a group B. By this group grouping, when it is necessary to form a fine resist pattern in a range of permissible errors over the whole area of the slit direction, any exposure apparatus 1 belonging to the group A may be used to carry out the exposure operation. On the other hand, when it is not necessary to form the fine resist pattern with a strict precision over the whole area of the slit direction, any exposure apparatus 1 belonging to the group B may be used to carry out the exposure operation. Additionally, needless to say, any exposure apparatus 1 of the group A may also be used to carry out the exposure operation, even when it is not necessary to form the fine resist pattern with the strict precision over the whole area of the slit direction.

Moreover, for P4 of the exposure apparatus 1, the dimensional error of the actually formed resist pattern can be kept at about +5 nm or less in IV to X of ten sampling points I to X. Here, for a new group, four units P1, P2, P4, and P5 of the exposure apparatuses 1 are grouped in a group C. By this group grouping, with the use of the reticle 10 in which the fine mask pattern is formed in a portion corresponding to the area (partial exposure area) including the sampling points IV to X in the slit area 17, any exposure apparatus 1 belonging to the group C may be used to carry out the exposure operation. Accordingly, it is possible to form the fine resist pattern with the dimensional error suppressed to about ±5 nm in the area (partial exposure area) including the sampling points IV to X in the slit area 17.

Figure 6:
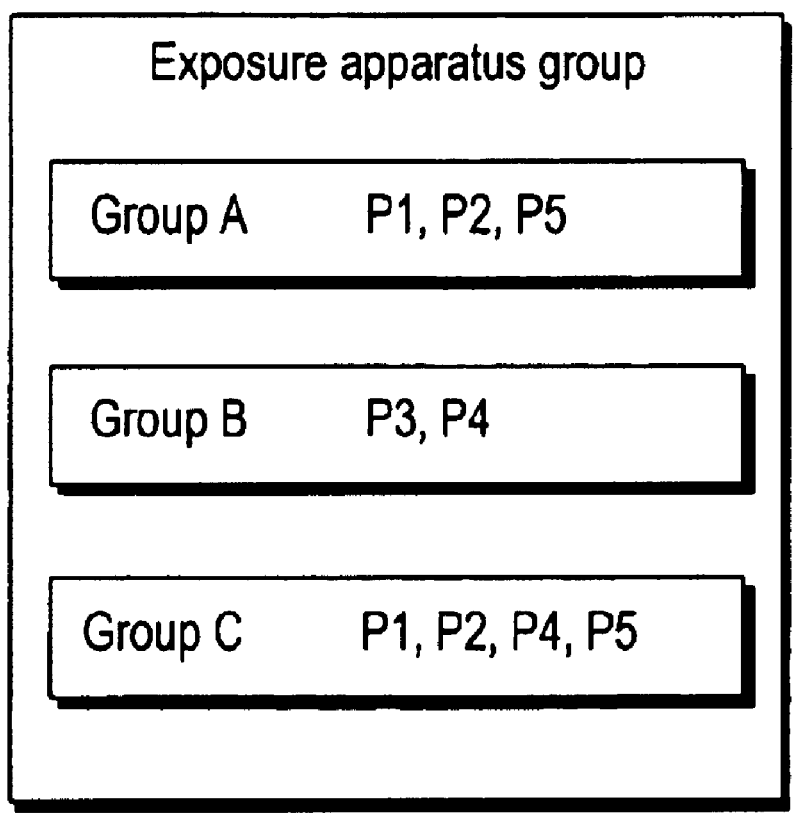
FIG. 6 is a diagram showing grouped exposure apparatuses.

FIG. 6 shows exposure apparatuses P1, P2, P3, P4 and P5 grouped by the step described above, and exposure groups A, B and C to which these exposure apparatuses P1 to P5 belong.

It is said that a fluctuation width (error) of a pattern dimension allowed in the exposure area 16 is about $\frac{1}{10}$ of a minimum pattern dimension. Concretely, for example, when the resist pattern having a pattern dimension of about 110 to 130 nm is formed, only a fluctuation width of about ±10 nm is permitted. In the present embodiment, it is possible to form the fine resist pattern whose target dimension value is set to 140 nm in the whole exposure area 16, while the dimensional error is suppressed to about ±5 nm or less. That is, in the whole exposure area 16, the dimensional error of the resist pattern can largely be suppressed from $\frac{1}{10}$ of the target dimension value which is the permissible range to form the fine resist pattern.

In this manner, in the present embodiment, with respect to a plurality of exposure apparatuses 1, one or a plurality of exposure apparatuses 1 in which the dimensional differences of the exposed patterns transferred using the exposure apparatuses 1 among the exposure apparatuses 1 are within a predetermined permissible range are selected for each predetermined exposure area (partial exposure area) in the whole exposure area 16. Concretely, one or a plurality of exposure apparatuses 1 in which the dimensional differences of the exposed patterns among the exposure apparatuses 1 are within about ±5 nm are selected for each predetermined partial exposure area. Additionally, one or a plurality of exposure apparatuses 1 in which the dimensional error from the target dimension of each exposed pattern transferred using the exposure apparatuses 1 is within the predetermined permissible range are selected for each predetermined partial exposure area in the whole exposure area 16. Concretely, one or a plurality of exposure apparatuses 1 in which the error from the dimension of 140 nm of each exposed pattern is within about ±5 nm are selected for each predetermined partial exposure area. Moreover, the selected exposure apparatuses 1 are grouped in one group for each selected exposure area, and a plurality of exposure apparatuses 1 are managed for each of these groups. Thereafter, when the exposed pattern is transferred onto the resist film 15, the exposure apparatus group corresponding to each area is selected from a plurality of exposure apparatuses 1 for each predetermined partial exposure area onto which the exposed pattern is to be transferred, and one or a plurality of exposure apparatuses 1 belonging to the selected exposure apparatus group are used to carry out the exposure operation.

A plurality of exposure apparatuses 1 are grouped and managed beforehand by the above-described classification method. Therefore, every shift of the transfer area of the exposed pattern, the appropriate exposure apparatus 1 can easily and quickly be selected from the exposure apparatus group corresponding to each transfer area to easily and quickly carry out the exposure operation in an adequate state. Accordingly, the dimensional difference and error of the exposed pattern are fitted within the permissible range in the predetermined partial exposure area, and the fine exposed pattern can easily and efficiently be transferred onto the resist film 15 with high precision. Additionally, the dimensional error of the exposed pattern is fitted within the permissible range in the whole exposure area 16, and the fine exposed pattern can easily and efficiently be transferred onto the resist film 15 with the high precision.

Moreover, each exposed pattern is preferably transferred using the mask (reticle) 10 prepared based on mask data (reticle data) which has the same content. Especially, each exposed pattern transferred onto the same mask layer of a semiconductor device (not shown) using each exposure apparatus 1 of the same group is preferably transferred using the reticle 10 prepared based on the reticle data which has the same content. This will concretely be described hereinafter.

For example, in FIGS. 1 and 2, the resist film 15 is a predetermined mask layer in the semiconductor device. When the dimensional difference and error of the exposed pattern transferred onto the mask layer have a distribution in the slit direction, the distribution of the dimensional difference and error of each exposed pattern may be adjusted (corrected) within a predetermined permissible range with respect to the respective mask patterns 11 formed in a plurality of reticles 10 for use in the plurality of exposure apparatuses 1. Concretely, each mask pattern 11 is biased in a direction in which the dimensional fluctuation of each exposed pattern is corrected so that the distribution of the dimensional difference between the reticles 10 of each exposed pattern is within the predetermined permissible range. Additionally, each mask pattern 11 is biased in the direction in which the dimensional fluctuation of each exposed pattern is corrected so that the distribution of dimensional errors of each exposed pattern from the target dimension is within the predetermined permissible range. Accordingly, it is possible to hold the dimensional precision of each transferred exposed pattern, especially the dimensional precision of each resist pattern formed based on each exposed pattern at desired precision.

For example, among five units P1 to P5 of exposure apparatuses 1, only P3 of exposure apparatus 1 is newly grouped and managed as the exposure apparatus 1 of a group D. Moreover, the mask patterns 11 formed in the plurality of reticles 10 for use in the exposure apparatus 1 belonging to the group D, that is, P3 of exposure apparatus 1 are corrected as follows. Additionally, to facilitate understanding of the description in the present embodiment, one reticle 10 will be described hereinafter. For the mask pattern 11, the mask pattern 11 formed in a portion corresponding to each area including the sampling points I, II, IX, X in the slit area 17 is biased by about ±12 nm. The mask pattern 11 formed in the portion corresponding to each area including the sampling points III, IV, VII, VIII in the slit area 17 is biased by about ±6 nm. In this manner, the mask pattern 11 formed in one reticle 10 is biased in accordance with each portion corresponding to the predetermined exposure area so as to bring the dimensional error of the exposed pattern within the predetermined permissible range in the whole slit direction of the exposure area 16. Moreover, the reticle (mask) 10 in which the mask pattern 11 is corrected at the set value is referred to as MASK-D.

Similarly, among five units P1 to P5 of exposure apparatuses 1, only P4 of exposure apparatus 1 is newly grouped and managed as the exposure apparatus 1 of a group E. Moreover, the mask pattern 11 formed in one reticle 10 for use in the exposure apparatus 1 of the group E, that is, P4 of exposure apparatus 1 is corrected as follows. For the mask pattern 11, the mask pattern 11 formed in the portion corresponding to the area including the sampling point I in the slit area 17 is biased by about −9 nm. The mask pattern 11 formed in the portion corresponding to each area including the sampling points II, III in the slit area 17 is biased by about −6 nm. The reticle 10 in which the mask pattern 11 is corrected in this manner is referred to as MASK-E. For three units P1, P2, and P5 of exposure apparatuses 1 classified in the group A, the dimensional differences of each exposed pattern between the apparatuses is about 10 nm or less in all the sampling points in the exposure area 16. Therefore, three units P1, P2, and P5 of exposure apparatuses 1 are grouped and managed as the same group.

Moreover, the mask patterns 11 of the reticles 10 for use together with the exposure apparatuses 1 of the group A may all be the same pattern. In this case, a correction amount with respect to each mask pattern 11 is set to 0 in any sampling point of the slit area 17. That is, the reticle 10 in which the mask pattern 11 is not especially biased is referred to as MASK-A.

Figure 4:
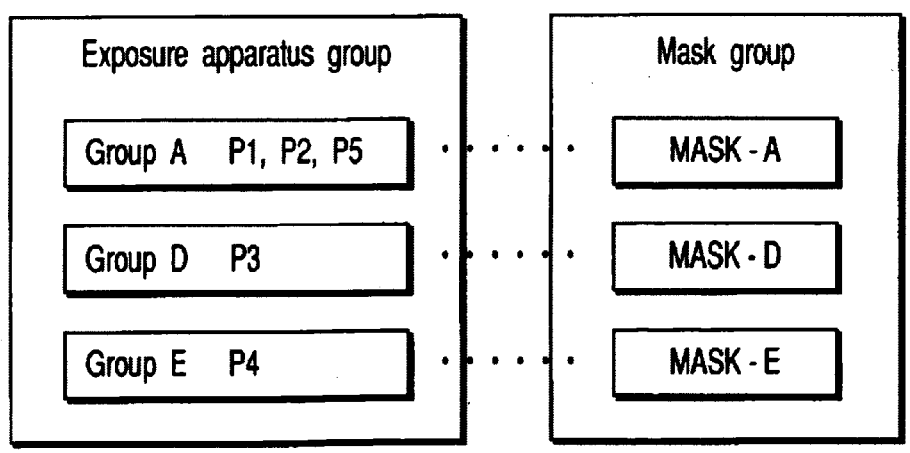
FIG. 4 is a graph showing an appropriate combination of an exposure apparatus group with a mask group.

As described above, when the dimensional differences and errors of the exposed patterns have the distribution in the slit direction, the respective exposure apparatuses 1 grouped beforehand by the above-described classification method are further grouped and managed in accordance with the tendency of the distribution of the dimensional difference and error of the exposed pattern. Additionally, the respective reticles 10 grouped beforehand together with the respective exposure apparatuses 1 are grouped and managed in accordance with the tendency of the bias applied to the respective mask patterns it formed in these reticles. Appropriate combinations of a plurality of exposure apparatus groups with a plurality of mask (reticle) groups prepared and grouped in accordance with the respective exposure apparatus groups are shown in FIG. 4. As shown in FIG. 4, when the exposure operation is carried out, the reticle 10 belonging to MASK-A is used with respect to the exposure apparatuses 1 of the group A, the reticle 10 belonging to MASK-D is used with respect to the exposure apparatuses 1 of the group D, and the reticle 10 belonging to MASK-E is used with respect to the exposure apparatuses 1 of the group E. That is, each exposed pattern transferred using the respective exposure apparatuses 1 in the same group is transferred using the reticle 10 prepared based on the reticle data which has the same content. In this manner the exposure apparatus 1 and reticle 10 forming the appropriate combination are selected from the exposure apparatus group and mask group to perform the exposure operation. Accordingly, the dimensional difference and error of the exposed pattern can be fitted within the permissible range in both the slit and scan directions.

That is, when the plurality of exposure apparatuses 1 is used to perform the exposure operation, the exposure apparatuses 1 and reticles 10 are managed beforehand based on the above-described grouping. Accordingly, the fine exposed pattern can easily and quickly be transferred, while the dimensional precision is kept at a high precision in the whole exposure area 16. This is an important and efficient managing method for the exposure method in a mass production line.

A series of sequences from the measurement of the dimension of the exposed pattern to the mask exposure described above, that is, major parts of the sequence of the exposure method according to the present embodiment are shown in a flowchart of FIG. 5.

As described above, according to the managing method of the exposure apparatus according to the present embodiment, when the plurality of exposure apparatuses 1 are used to perform the exposure operation, improvement of the precision of the transfer error of each exposure apparatus 1 is not required. The exposure operation can easily and efficiently be carried out with the high precision so that the dimensional error of the actually formed resist pattern is within the permissible range. The dimensional difference of the actually formed resist pattern among the exposure apparatuses 1 can also be reduced.

Similarly, according to the managing method of the mask according to the present embodiment, when the plurality of exposure apparatuses 1 are used to perform the exposure operation, the improvement of the dimensional precision of the mask pattern 11 formed in each reticle 10 for use in each exposure apparatus 1 is not required. The exposure operation can easily and efficiently be carried out with the high precision so that the dimensional error of the actually formed resist pattern is within the permissible range. Therefore, when the managing method of the mask is used together with the managing method of the exposure apparatus, the dimensional error of the actually formed resist pattern can remarkably be reduced. The dimensional difference of the actually formed resist pattern among the exposure apparatuses 1 can also remarkably be reduced.

Moreover, in the exposure method according to the present embodiment, the plurality of exposure apparatuses 1 are grouped and managed so that the distribution of the dimensional errors of the exposed patterns caused by various dimensional error factors (transfer error factors) of the exposed patterns such as the illumination a, numerical aperture (NA), illuminance, astigmatism, and spherical aberration of the apparatus 1 has the same tendency. Concretely, the plurality of exposure apparatuses 1 are grouped and managed based on the tendency of the dimensional fluctuation of each resist pattern so that the distribution of the fluctuations (scatterings) of the dimensions of the resist patterns formed in the resist film 15 using the apparatuses 1 indicates the same tendency for each predetermined exposure area.

Additionally, with respect to the respective exposure apparatuses 1 grouped/managed based on the classification method, one or a plurality of masks 10 are prepared based on the same design data for each exposure apparatus group, and these masks 10 are grouped/managed. That is, each mask 10 is biased for the correction of each error with respect to the portion which is the error factor of each mask pattern 11 so that a systematic error of each exposed pattern in the predetermined exposure area is within the permissible range. Moreover, the exposure apparatus 1 selected from the exposure apparatus group corresponding to the predetermined exposure area and the mask 10 selected from the mask group corresponding to the group from which the exposure apparatus 1 is selected are used in a pair to perform the exposure operation. Accordingly, when a plurality of exposure apparatuses 1 are used to perform the exposure operation, the dimensional fluctuation (dimensional error) based on the systematic error of each exposed pattern can be fitted within a constant standard value in the whole exposure area 16. The exposure apparatus 1 and mask 10 in which the dimensional error of the exposed pattern is within the permissible range are easily and quickly selected, and the fine mask pattern 11 can easily and efficiently be transferred with the high precision.

Next, a manufacturing method of the semiconductor device according to one embodiment of the present invention will briefly be described. The manufacturing method of the semiconductor device according to the present embodiment includes steps of carrying out an etching process based on the exposed pattern transferred by the exposure method according to the present embodiment. According to the exposure method of the present embodiment, the exposed pattern can easily and efficiently be transferred onto the resist film 15 with high precision. Therefore, when the etching process is carried out based on the exposed pattern transferred by the exposure method of the present embodiment, various fine semiconductor elements (not shown) to be incorporated in the semiconductor device can efficiently be formed with the high precision. Accordingly, a quality and yield of the semiconductor device can be enhanced. In this manner, according to the manufacturing method of the semiconductor device of the present embodiment, a high-quality semiconductor device can efficiently be manufactured.

It is to be noted that the managing method of the exposure apparatus, the managing method of the mask, the exposure method, and the manufacturing method of the semiconductor device according to the present invention are not restricted to the above-described embodiment. Without departing from the scope of the present invention, the compositions or processes may partially be changed to various settings, or various settings may appropriately be combined, used, or carried out.

For example, one exposure apparatus 1 belongs to each of the groups D and E among the respective exposure apparatus groups but, needless to say, a plurality of apparatuses may belong. Each mask (reticle) 10 belonging to each mask group was used in which the mask pattern 11 formed in the mask 10 of non-corrected MASK-A was given a predetermined bias different with each mask group. Additionally, when there are a large number of exposure apparatuses 1 in the same group, a plurality of masks 10 having the same specifications are prepared for each exposure apparatus group or each mask group without any problem in carrying out the present invention.

Moreover, the mask 10 belonging to MASK-A is different from that belonging to MASK-B not only in the mask bias applied to the mask pattern (device pattern) 11 but also in an alignment mark in some cases. This is because even the exposure apparatuses 1 including optical systems capable of fulfilling the same degree of capabilities with respect to resolutions do not necessarily include the same marks for use in the alignment. For a way of applying the mask bias, for example, when two right and left parallel line patterns are required as the mask pattern 11, a bias value of the pattern on the left side may be set to be different from that of the pattern on the right side. This is because with the line width fluctuation of the exposed pattern caused by aberration by a frame, the patterns brought close to each other are sometimes different from each other in a way of being influenced by the aberration. In this case, one mask 10 may sometimes belong to a plurality of mask groups in accordance with the bias amount applied to each portion of the mask pattern 11 formed in the mask. Additionally, even in this case, there is not any problem in the embodiment of the present invention.

Moreover, in the above-described embodiment, after transferring the exposed pattern onto the resist film 15, the dimension of the resist pattern formed based on the exposed pattern was measured to check the dimension of the exposed pattern. Additionally, the dimension of the resist pattern processed in a predetermined manner may also be used as the dimension of the exposed pattern. For example, when there is further an etching or another processing step as a post-process with respect to the resist pattern, the dimension of the processed resist pattern can be measured without departing from the scope of the present invention. Accordingly, the dimensional precisions of the exposed and resist patterns can be enhanced. Moreover, various fine semiconductor elements in the semiconductor device formed based on the patterns can be formed with a higher precision. Furthermore, the quality of the semiconductor device can further be enhanced. This also applies in checking various transfer errors such as the dimensional or shape difference among the exposed patterns or differences of transfer characteristics among the apparatuses.

Furthermore, even when a so-called superposition exposure is carried out, the present invention can be applied. The plurality of exposure apparatuses 1 are grouped and managed for each predetermined area in accordance with the tendency of the error factor of the transfer position of the exposed pattern of the apparatus. Concretely, in the same manner as in the grouping of the exposure apparatuses 1 described above, so-called transfer errors such as the dimensional or shape difference of each exposed pattern projected (transferred) onto the resist film 15 are measured as the difference of the transfer position of the exposed pattern among the plurality of exposure apparatuses 1. In this case, various transfer errors of the exposed patterns may be checked by measurement of the dimension of the resist pattern formed based on each exposed pattern transferred onto the resist film 15 or by measurement of the dimension of the resist pattern obtained by processing the formed resist pattern.

Moreover, one or a plurality of exposure apparatuses 1 in which the transfer error of the exposed patterns among the exposure apparatuses 1 is within a predetermined permissible range are selected for each predetermined exposure area based on a result of the check of the transfer error among the exposed patterns, grouped, and managed. The plurality of exposure apparatuses 1 grouped/managed in this manner is selectively used for each predetermined exposure area to perform the superposition exposure. Accordingly, the transfer error of the exposed pattern among the exposure apparatuses 1 in carrying out the superposition exposure is controlled so as to be satisfactory, and each mask pattern 11 formed in the mask 10 can be superposed/exposed with the high precision.

It is to be noted that the error factors of the transfer position of the exposed pattern concretely include the illumination a, NA, illuminance, distortion, frame aberration, and astigmatism of the exposure apparatus 1. These are also transfer characteristics of the exposure apparatus. Therefore, when the plurality of exposure apparatuses 1 are used to perform the superposition exposure, instead of grouping and managing the exposure apparatuses 1 based on the transfer error of the exposed pattern transferred onto the resist film 15, the exposure apparatuses 1 may also be grouped and managed based on the difference of the transfer characteristics among the exposure apparatuses 1. When the superposition exposure is carried out, especially a distortion difference among the exposure apparatuses 1 is important as a difference of the transfer characteristic among the exposure apparatuses 1. Therefore, when the plurality of exposure apparatuses 1 are used to carry out the superposition exposure, it is very effective to group and manage the exposure apparatuses 1 based on not only the dimension and shape differences but also the distortion difference.

Moreover, when the superposition exposure is carried out, a plurality of masks 10 in which the position of the mask pattern 11 of the mask 10 is shifted and formed beforehand in a direction for correcting the transfer error of the exposure apparatus 1 may also be used as the mask 10 for use in each exposure apparatus 1. Furthermore, in the same manner as in the exposure apparatuses 1, one or a plurality of masks in which the transfer error of each exposed pattern among the masks 10 is within the predetermined permissible range are selected for each predetermined exposure area, and the selected masks 10 are grouped in one group and managed. Alternatively, the plurality of masks 10 may also be used in which the position of the mask pattern 11 of each mask 10 is shifted and formed beforehand in a direction for correcting (suppressing/adjusting) the difference of the transfer characteristic among the exposure apparatuses 1, especially the distortion difference. In this case, the masks 10 are grouped and managed in accordance with the correction applied to each mask pattern 11. When the correction applied to each mask pattern 11 differs with each portion of the mask pattern 11, the masks 10 may also be grouped and managed for each portion.

As described above, the exposure apparatuses 1 and masks 10 are grouped/managed so that the dimensional error of each exposed pattern transferred using the apparatuses and masks, is within the permissible range. Therefore, the group management based on the dimensional error of each exposed pattern is used together with the group management based on the transfer error among the patterns in superposing the exposed patterns upon one another or based on the difference of the transfer characteristic among the exposure apparatuses 1, the plurality of exposure apparatuses 1 and masks 10 can be used to easily and efficiently carry out the superposition exposure with the high precision. It is to be noted that even when the group management based on the dimensional error of each exposed pattern, the group management based on the transfer error among the patterns in superposing the exposed patterns upon one another, and the group management based on the difference of the transfer characteristic among the exposure apparatuses 1 are simultaneously carried out, needless to say, there is not any problem in the present invention. Needless to say, these group managements may also be carried out, even when the superposition exposure is not carried out.

Furthermore, to carry out the superposition exposure, at least one exposure apparatus 1 is selected as a standard for each predetermined exposure area so that the exposed pattern can be projected/exposed with an appropriate precision. Additionally, one or a plurality of exposure apparatuses 1 capable of projecting/exposing the exposed pattern whose transfer error with respect to the exposed pattern as the standard projected/exposed by the exposure apparatus 1 as the standard is within the predetermined permissible range are selected for each predetermined exposure area. Moreover, the exposure apparatuses 1 selected for each predetermined exposure area may also be grouped in one group and managed. When the exposed pattern projected/ exposed as the standard by the exposure apparatus 1 as the standard has a preset ideal dimension and shape, the superposition exposure can be carried out with a remarkably high precision by the exposure method based on the group management.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A managing method of an exposure apparatus, comprising:

selecting one or more exposure apparatuses out of a plurality of the exposure apparatuses for each a predetermined partial exposure area, whose dimensional differences of each an exposed pattern among the exposure apparatuses are within a predetermined permissible range in each the predetermined partial exposure area in a whole of an exposure area which is the exposed patterns are transferred using the exposure apparatuses; and managing the exposure apparatuses which are selected for each the predetermined partial exposure area, as a group of the exposure apparatuses, by grouping the exposure apparatuses for each the predetermined partial exposure area.

2. The managing method of an exposure apparatus according to claim 1, further comprising:

selecting one or more distortion amounts exposure apparatuses out of the exposure apparatuses for each the predetermined partial exposure area, whose dimensional errors of each the exposed pattern from a target dimension is within a predetermined permissible range in the predetermined partial exposure area; and managing the exposure apparatuses which are selected for each the predetermined partial exposure area, as a group of the exposure apparatuses, by more grouping the exposure apparatuses as to each the predetermined partial exposure area.

3. The managing method of an exposure apparatus according to claim 1, wherein:

a dimension of each a resist pattern obtained by subjecting the resist pattern formed based on each exposed pattern transferred onto a resist film on a substrate using each the exposure apparatus to predetermined processing is used as a dimension of the exposed pattern.

4. The managing method of an exposure apparatus according to claim 1, further comprising:

selecting one or more the exposure apparatuses out of the exposure apparatuses for each the predetermined partial exposure area, whose transfer errors of each the exposed pattern among the exposure apparatuses is within a predetermined permissible range in the predetermined partial exposure area; and managing the exposure apparatuses which are selected for each the predetermined partial exposure area, as a group of the exposure apparatuses, by grouping the exposure apparatuses as to each the predetermined partial exposure area.

5. The managing method of the exposure apparatus according to claim 4, wherein:

the transfer error of the exposed pattern among the exposure apparatuses is checked based on the dimension of each resist pattern obtained by subjecting the resist pattern formed based on the exposed pattern transferred onto a resist film on a substrate using the exposure apparatus to predetermined processing.

6. The managing method of an exposure apparatus according to claim 1, further comprising:

selecting one or more the exposure apparatuses out of the exposure apparatuses for each the predetermined partial exposure area, whose differences of transfer characteristics among the exposure apparatuses is within a predetermined permissible range in the predetermined partial exposure area; and managing the exposure apparatuses which are selected for each the predetermined partial exposure area, as a group of the exposure apparatuses, by more grouping the exposure apparatuses as to each the predetermined partial exposure area.

7. The managing method of the exposure apparatus according to claim 6, wherein:

a distortion difference among the exposure apparatuses is used as a difference of a transfer characteristic among the exposure apparatuses.

8. The managing method of an exposure apparatus according to claim 1, wherein:

the exposed pattern transferred onto the same mask layer of a semiconductor device using the exposure apparatuses in the same group in the respective exposed patterns is transferred using a mask prepared based on mask data which has the same content.

9. A managing method of a mask, comprising:

selecting one or more masks out of a plurality of masks using together with at least one exposure apparatus for each a predetermined partial exposure area, whose dimensional differences of each an exposed pattern among the masks are within a predetermined permissible range in each the predetermined partial exposure area in a whole of an exposure area which is the exposed patterns are transferred based on each a mask pattern formed in the masks; and managing the masks which are selected for each the predetermined partial exposure area, as a group of the masks, by grouping the masks for each the predetermined partial exposure area.

10. The managing method of the mask according to claim 9, further comprising:

adjusting masks in which the dimensional difference of each exposed pattern among the masks is outside the predetermined permissible range in the predetermined partial exposure area in the respective masks so as to bring the dimensional difference within the predetermined permissible range; and grouping and managing the adjusted masks for each the predetermined partial exposure area in accordance with the adjustment.

11. The managing method of the mask according to claim 9, further comprising:

selecting one or more the masks out of the masks for each the predetermined partial exposure area, whose dimensional errors of each the exposed pattern from a target dimension is within a predetermined permissible range in the predetermined partial exposure area; and managing the masks which are selected for each the predetermined partial exposure area, as a group of the masks, by grouping the masks for each the predetermined partial exposure area.

12. The managing method of the mask according to claim 11, further comprising:

adjusting masks in which the dimensional error of each exposed pattern from the target dimension is outside the predetermined permissible range in the predetermined partial exposure area in the respective masks so as to bring the error into the predetermined permissible range; and grouping and managing the adjusted masks for each the predetermined partial exposure area in accordance with the adjustment.

13. The managing method of the mask according to claim 9, wherein:

a dimension of a resist pattern obtained by subjecting the resist pattern formed based on each exposed pattern transferred onto a resist film on a semiconductor substrate using each mask to predetermined processing is used as a dimension of the exposed pattern.

14. The managing method of the mask according to claim 9, further comprising:

selecting one or more the masks out of the masks for each the predetermined partial exposure area, whose transfer errors of each the exposed pattern among the masks is within a predetermined permissible range in the predetermined partial exposure area; and grouping and managing these selected masks as one group, and managing the plurality of masks.

15. The managing method of the mask according to claim 14, further comprising:

adjusting masks in which the transfer error of each exposed pattern among the masks is outside the predetermined permissible range in the predetermined partial exposure area in the respective masks so as to bring the transfer error into the predetermined permissible range; and grouping and managing the adjusted masks for each the predetermined partial exposure area in accordance with the adjustment.

16. The managing method of the mask according to claim 14, wherein:

the transfer error of each exposed pattern among the masks is checked based on the dimension of each resist pattern obtained by subjecting the resist pattern formed based on the exposed pattern transferred onto a resist film on a substrate using each mask to predetermined processing.

17. The managing method of the mask according to claim 9, further comprising:

using the plurality of exposure apparatuses and selecting one or more exposure apparatuses out of the exposure apparatuses for each the predetermined partial exposure area, whose dimensional differences of each the exposed pattern among the exposure apparatuses are within the predetermined permissible range in each the predetermined partial exposure area in the whole of the exposure area which is the exposed patterns are transferred using the exposure apparatuses; and grouping and managing these exposure apparatuses as one group, and managing the plurality of exposure apparatuses; and grouping and managing the masks in accordance with each exposure apparatus group.

18. The managing method of the mask according to claim 17, wherein the respective masks are grouped in accordance with the respective exposure apparatus groups grouped and managed based on a difference of a transfer characteristic among the exposure apparatuses.

19. The managing method of the mask according to claim 17, wherein:

the exposed pattern transferred onto the same mask layer of a semiconductor device using the respective exposure apparatuses in the same group in the respective exposed patterns is transferred using the mask prepared based on mask data which has the same content.

20. The managing method of the mask according to claim 18, wherein:

a distortion difference among the exposure apparatuses is used as the difference of the transfer characteristic among the exposure apparatuses.

21. The managing method of the mask according to claim 20, further comprising:

adjusting masks in which the distortion difference of each exposed pattern among the exposure apparatuses is outside the predetermined permissible range in the predetermined partial exposure area in the respective masks so as to bring the distortion difference into the predetermined permissible range; and grouping and managing the adjusted masks for each the predetermined partial exposure area in accordance with the adjustment.

22. An exposure method comprising:

selecting and grouping one or more exposure apparatuses out of a plurality of the exposure apparatuses for each a predetermined partial exposure area beforehand with transferring mask patterns formed in a plurality of mask onto a substrate using the exposure apparatuses, whose dimensional differences of each an exposed pattern among the exposure apparatuses, transferred onto the substrate based on each the mask pattern, are within a predetermined permissible range in each the predetermined partial exposure area in a whole of an exposure area which is provided on the substrate and is the exposed patterns are transferred; and transferring the mask patterns onto the substrate for each a predetermined partial exposure area using the one or more exposure apparatuses belonging to each a group of exposure apparatuses corresponding to the predetermined partial exposure areas.

23. The exposure method according to claim 22, further comprising:

selecting one or a plurality of the exposure apparatuses out of a plurality of the exposure apparatuses for each the predetermined partial exposure area beforehand with transferring mask patterns, whose dimensional errors of each the exposed patterns from a target dimension are within the predetermined permissible range in each the predetermined partial exposure area; and grouping these selected exposure apparatuses in one group to further group.

24. The exposure method according to claim 22, wherein:

a dimension of a resist pattern obtained by subjecting the resist pattern formed based on each exposed pattern transferred onto a resist film on a substrate to predetermined processing is used as a dimension of the exposed pattern.

25. The exposure method according to claim 22, further comprising:

selecting one or a plurality of exposure apparatuses in which a transfer error of each exposed pattern among the exposure apparatuses is within a predetermined permissible range in the predetermined partial exposure area for each predetermined exposure area from the exposure apparatuses; and grouping these selected exposure apparatuses in one group to further group.

26. The exposure method according to claim 25, wherein:
the transfer error of each exposed pattern among the exposure apparatuses is checked based on the dimension of each resist pattern obtained by subjecting the resist pattern formed based on the exposed pattern transferred onto a resist film on a substrate to predetermined processing.

27. The exposure method according to claim 22, further comprising:
selecting one or a plurality of exposure apparatuses in which a difference of a transfer characteristic among the exposure apparatuses is within a predetermined permissible range in the predetermined partial exposure area for each predetermined exposure area from the respective exposure apparatuses; and
grouping these selected exposure apparatuses in one group to further group.

28. The exposure method according to claim 27, wherein:
a distortion difference among the exposure apparatuses is used as the difference of the transfer characteristic among the exposure apparatuses.

29. The exposure method according to claim 22, wherein:
the exposed pattern transferred onto the same mask layer of a semiconductor device using the exposure apparatuses in the same group in the respective exposed patterns is transferred using a mask prepared based on mask data which has the same content.

30. The exposure method according to claim 22, further comprising:
selecting one or more masks out of a plurality of masks for each the predetermined partial exposure area, whose dimensional differences of each an exposed pattern among the masks are within a predetermined permissible range in each the predetermined partial exposure area in a whole of an exposure area which is the exposed patterns are transferred based on each a mask pattern formed in the masks; and
managing the masks which are selected for each the predetermined partial exposure area, as a group of the masks, by grouping the masks for each the predetermined partial exposure area.

31. A manufacturing method of a semiconductor device, comprising:
selecting and grouping one or more exposure apparatuses out of a plurality of the exposure apparatuses for each a predetermined partial exposure area beforehand with transferring mask patterns formed in a plurality of mask onto a substrate using the exposure apparatuses, whose dimensional differences of each an exposed pattern among the exposure apparatuses, transferred onto the substrate based on each the mask pattern, are within a predetermined permissible range in each the predetermined partial exposure area in a whole of an exposure area which is provided on the substrate and the exposed patterns are transferred;
transferring the mask patterns onto the substrate for each a predetermined partial exposure area using the one or more exposure apparatuses belonging to each a group of exposure apparatuses corresponding to the predetermined partial exposure areas; and
carrying out an etching process based on each the mask pattern transferred onto the substrate.

32. A method of managing exposure apparatuses used to form transfer patterns onto an exposure area of a substrate formed of a plurality of predetermined partial exposure areas, comprising:
for each partial exposure area, determining dimensional differences of exposed patterns formed by the exposure apparatuses in the partial exposure area; and
for each partial exposure area, forming a group of exposure apparatuses by selecting exposure apparatuses having dimensional differences of exposed patterns that are within a predetermined permissible range for the partial exposure area.

33. A manufacturing method of a semiconductor device having a substrate which includes a plurality of predetermined partial exposure areas, using a plurality of exposure apparatuses and plurality of masks, comprising:
for each partial exposure area, selecting exposure apparatuses and masks to form a group of mask-exposure apparatus combinations such that dimensional differences formed by use of the mask-exposure apparatus combinations are within a predetermined permissible range;
for each partial exposure area, transferring a mask pattern onto the partial exposure area using a mask-exposure apparatus combination from the group corresponding to the partial exposure area; and
etching the substrate using the transferred mask patterns.

* * * * *